United States Patent [19]
Nowak

[11] 3,969,644
[45] July 13, 1976

[54] PULSE GENERATOR WITH ASYMMETRICAL MULTI-POLE MAGNET

[75] Inventor: Walter J. Nowak, Vernon, Conn.

[73] Assignee: Veeder Industries, Inc., Hartford, Conn.

[22] Filed: Feb. 3, 1975

[21] Appl. No.: 546,259

Related U.S. Application Data

[62] Division of Ser. No. 450,562, March 13, 1974, Pat. No. 3,893,059.

[52] U.S. Cl. .............................. 310/152; 310/156; 335/306
[51] Int. Cl.² ....................................... H02K 21/00
[58] Field of Search .......... 335/302, 303, 284, 306, 335/289; 310/152, 156, 154, 162–164, 268, 103

[56] References Cited
UNITED STATES PATENTS

| | | | |
|---|---|---|---|
| 3,149,256 | 9/1964 | Kohlhagen | 310/156 |
| 3,304,449 | 2/1967 | Pohlman et al. | 310/103 |
| 3,335,377 | 8/1967 | Kohlhagen | 310/156 X |
| 3,355,645 | 11/1967 | Kawakami et al. | 310/156 X |
| 3,678,311 | 7/1972 | Mattingly | 310/156 |
| 3,803,433 | 4/1974 | Ingenito | 310/163 X |
| 3,855,490 | 12/1974 | Sidell | 310/162 |

Primary Examiner—Donovan F. Duggan
Attorney, Agent, or Firm—Prutzman, Hayes, Kalb & Chilton

[57] ABSTRACT

A pulse generator is comprised of an asymmetrical magnet assembly and a Hall sensor operative for generating an electrical signal upon the application of a magnetic field thereto. The Hall sensor and magnet assembly are mounted for relative movement for the generation of a train of electrical signals in response to relative displacement therebetween. The asymmetrical multi-pole magnets in the magnet assembly have a plurality of symmetrically spaced pole pairs with each pole pair including a magnetic pole of predominant polarity occupying a substantially greater area than the pole of opposite polarity. The predominant pole is sufficiently strong to provide a salient magnetic field of essentially single polarity. a magnetizing head also is provided for producing the asymmetrical pole character of the magnet.

8 Claims, 6 Drawing Figures

U.S. Patent   July 13, 1976   3,969,644

PULSE GENERATOR WITH ASYMMETRICAL MULTI-POLE MAGNET

This application is a division of application Ser. No. 450,562, filed Mar. 13, 1974, now U.S. Pat. No. 3,893,059.

BACKGROUND AND SUMMARY OF THE INVENTION

The present invention relates generally to pulse generators and is more particularly concerned with a new and improved pulse generator having an asymmetrical multi-pole magnet suited for use with a Hall effect pickup and with a magnetizing head particularly adapted to producing such an asymmetrical magnet.

Heretofore rotary pulse generators have been constructed with a magnetic readout head incorporating a Hall sensor and with a magnetic rotor cooperating with the readout head for applying an alternating magnetic field to the Hall sensor. Typical of such devices are the rotary pulse generators described in U.S. Pat. No. 3,742,243. In that patent one embodiment includes a rotor comprised of a pair of spaced coaxial ring magnets providing a plurality of substantially symmetrical poles of alternating magnetic polarity arranged for producing an alternating magnetic field within an annular air gap between the rings. per cent magnetic rings produce a salient magnetic field of dual polarity, i.e. in the positive and negative regions, resulting from the symmetrical multi-pole configuration of the magnetic ring construction. Substantially equally spaced electrical signals are generated within the Hall sensor as the rotor moves through a predetermined increment of angular displacement. In practice, it has been found that most rotary pulse generators are designed with a duty cycle operative within only the positive region of the magnetic curve so that the operate and release points of the Hall sensor switch most commonly use a maximum of only 50 percent of the total duty cycle of each pole pair of the magnets during their rotation. In actual practice the duty cycle obtained is limited to substantially less than 50 per cent and is generally in the range of thirty to 45 per cent of the magnetic flux curve for each pole pair. Accordingly, it is an object of the present invention to provide a new and improved pulse generator of the type described that utilizes a salient magnetic field of single polarity thereby extending the utility of the magnet and increasing the effective duty cycle thereof.

Another object of the present invention is to provide a multi-pole magnet having a plurality of symmetrically spaced pole pairs wherein the magnetic pole of one polarity occupies a substantially asymmetrical relationship to the pole of the opposite polarity to provide a salient magnetic field having an effective single polarity. Included in this object is the provision for the use of such a magnet within a Hall effect pulse generator.

Still another object of the present invention is to provide a new and improved asymmetrical multi-pole magnet having an extended duty cycle and therefore increased utility within a greater variety of applications.

A further object of the present invention is to provide a new and improved Hall effect pulse generator including an asymmetrical multi-pole magnet capable of providing a more perpendicular flux field capable of tolerating axial displacement of the magnet assembly with negligible effect on the duty cycle.

A still further object of the present invention is to provide a new and improved magnetizing head capable of rapidly and effectively producing an asymmetrical multipole magnet of the type described.

Other objects will be in part obvious and in part pointed out in more detail hereinafter.

These and related objects are accomplished in accordance with the present invention by providing a pulse generator comprising a magnetic field generator means and a Hall sensor operative for generating an electrical signal upon the application of a magnetic field thereto. The Hall sensor and magnetic field generator means are mounted for relative movement for the generation of a train of electrical signals in response to relative displacement therebetween. The magnetic field generator means includes an asymmetrical multi-pole magnet having a plurality of symmetrically spaced pole pairs. Each pole pair includes a magnetic pole of predominant polarity occupying a substantially greater area than the pole of opposite polarity with the predominant pole being sufficiently strong to provide a salient magnetic field of essentially single polarity. The asymmetrical magnet is formed of ceramic material and is magnetized using a magnetizing head comprising a cylindrical metal core having one end comprised of a symmetrical array of axially extending segments of substantially equal size, a winding fully circumscribing alternate segments and electrically insulated therefrom with the last turn of the winding on each alternate core segment being substantially flush with the one end of the core and an encasement protectively enclosing the winding and the segments while permitting exposure of the segments at the one end.

A better understanding of the invention will be obtained from the following detailed description and the accompanying drawing which set forth an illustrative embodiment indicative of the way in which the principles of the invention are employed.

A BRIEF DESCRIPTION OF THE DRAWING

DESCRIPTION OF A PREFERRED EMBODIMENT

Figure 2:
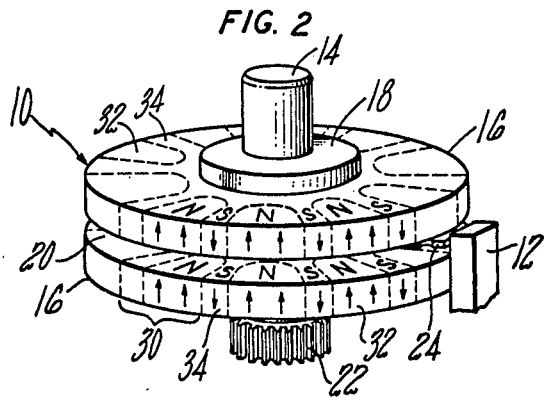
FIG. 2 is a perspective view of a portion of a Hall effect pulse generator utilizing the asymmetrical multipole magnet of FIG. 1.

Referring now to the drawing in greater detail wherein like reference numerals indicate like parts throughout the several figures, one embodiment of a pulse generator is shown in FIG. 2 as including a magnet assembly 10 and a pickup or readout assembly 12 positioned adjacent thereto for generating an electrical signal in response to the magnetic field emanating therefrom. The assembly 10 is illustrated in the form of a spool-like rotor having an axial shaft 14 coaxially supporting a pair of thin circular disc-like permanent magnets 16 through a hub member 18. The hub 18 is secured to the shaft 14 for rotation therewith and maintains a predetermined axial spacing or gap 20 between the permanent disc magnet 16. A gear 22 on one end of the shaft 14 is operatively connected to a rotary input (not shown) whereby the assembly 10 is rotated relative to the readout assembly 12.

The pickup or readout assembly 12 conveniently includes a "Hall Effect" sensor 24 positioned within the axial gap or spacing 20 between the magnets 16. The sensor 24 provides a magnetically operated threshold or switching arrangement operable for generating an electrical pulse or signal upon the application of an appropriate magnetic flux field. This solid state switch mounted within the space 20 between the magnets is connected to a suitable DC power supply for generating an electrical pulse or signal upon the application of a flux field of appropriate intensity. For example, the 2SS1 solid state switch made by Honeywell, Inc. and comprising a Hall sensor trigger and amplifier formed from a single silicon integrated circuit may be used for this purpose. Such a switch is unidirectional and requires that the magnetic field have an appropriate directional response to generate a pulse at one flux density level and to terminate the pulse or signal when the flux density falls below a minimum threshold level.

As will be appreciated, the various parts of the rotor assembly may be constructed of plastic, aluminum or other suitable nonmagnetic materials with the exception of the pair of axially spaced permanent magnets 16. The magnets are preferably composed of a single piece of ceramic or other suitable permanent magnet material that is capable of being magnetized as with a magnetizing head 28 of the type shown in FIGS. 5 and 6. In the preferred embodiment each disc magnet 16 is a barium ferrite type ceramic material.

Figure 1:
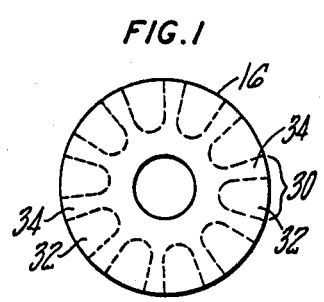
FIG. 1 is a plan view of an asymmetrical multipole magnet of the present invention.

It is a feature of the present invention that the multi-pole magnets 16 are provided with a plurality of substantially symmetrically spaced asymmetrical pole pairs 30 comprised of a predominant pole 32 and a subservient pole 34. In the embodiment illustrated in FIGS. 1 and 2 each magnet 16 is comprised of ten such pole pairs 30 symmetrically spaced about the disc to provide a radial pattern of magnetic poles oriented parallel to the axis of the disc. The predominant pole 32 of each pole pair 30 is shown as occupying approximately twice the area of the subservient pole 34. Thus for the ten pole pair magnet disc illustrated, the predominant pole 32 of each pole pair occupies an area corresponding to approximately 24° of the disc magnet 16 while its adjacent subservient pole 34 occupies an area corresponding to only 12° of the disc.

As shown in FIG. 2, the coaxially mounted asymmetrical magnets 16 in the pulse generator preferably are angularly related so that their opposed individual predominant and subservient poles 32 and 34 respectively are secured to the hub in spaced confronting relationship and in substantial magnetic and axial alignment. In other words, the predominant poles are angularly aligned with each other but in spaced apart confronting relationship with their unlike pole faces in axial alignment. In this arrangement a ring of flux field columns of alternating direction are produced between the two magnet discs. However, the poles 32 of predominant polarity effectively overpower the subservient poles 34 and create a more perpendicular flux field between the two magnets so that when the solid state switch pickup 24 is positioned within the axial space 20 between the magnets and at a particular radial position therein that results in obtaining the desired duty cycle, axial movement or displacement of the magnet assembly will have a negligible effect on the duty cycle of the rotary pluse generator.

As a result of the predominant/subservient pole pair arrangement each magnet 16 is of an asymmetrical multipole type that provides a salient magnetic field having a single effective polarity or direction as opposed to the conventional dual polarity exhibited by symmetrical multi-pole magnets. Thus, although the magnets are formed with twenty angularly spaced individual magnet poles and alternate poles are of opposite magnetic polarity, there is essentially no flux polarity reversal within each 36° pole pair segment due to the overpowering or predominating character of the predominant pole of each pole pair.

Figure 3:
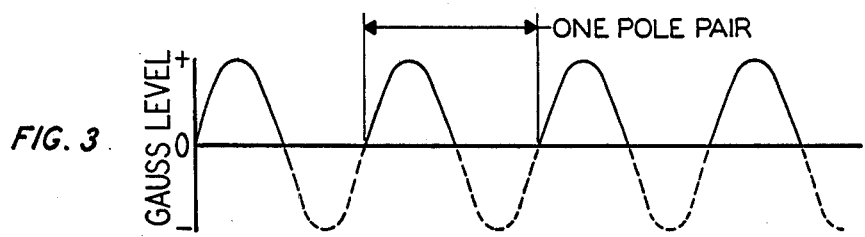
FIG. 3 is a graph illustrating the positive magnetic field component produced by a rotor utilizing a symmetrical multi-pole magnet.
Figure 4:
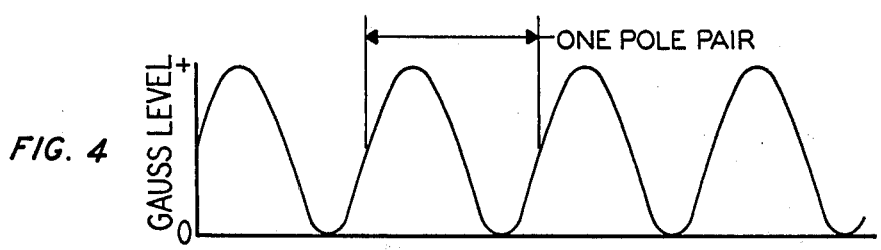
FIG. 4 is a graph illustrating the positive magnetic field component produced by a rotor of the same pole pair size utilizing an asymmetrical multi-pole magnet of the present invention.

This characteristic can be more readily understood and graphically illustrated when the asymmetrical magnet array is utilized in a rotary pulse generator to operate a "Hall Effect" solid state switch. In such an arrangement the flux density of a complete duty cycle of each pole pair follows a sinusoidal wave form and can be plotted in graph form as shown in FIGS. 3 and 4. Consequently, as depicted in FIG. 3 a symmetrical polarity array in a multi-pole magnet would exhibit substantially equal and complementary positive and negative flux density paths. The angular displacement of the assembly 10 relative to the pickup 12 results in a variation in the flux field passing through the Hall sensor 24 and this variation, in effect, follows the generally sinusoidal wave form shown in FIGS. 3 and 4. Most of the commonly available "Hall Effect" solid state switches possess operating and releasing points within the positive direction of region of the flux density curve. Thus the symmetrical magnetic assembly will have at a maximum a 50% duty cycle, with the actual duty cycle conventionally being limited to a range of only about 30 to 45 per cent. However, as depicted in FIG. 4, the asymmetrical character of the magnets of the present invention exhibit essentially no polarity reversal. Thus the positive region of the flux density curve of the asymmetrically multi-pole magnet is substantially extended to about twice that of the symmetrical magnet such that the operate and release points can also extend over a practical range of from 30 to 70 per cent or more of the duty cycle of each pole pair. As can be appreciated, this substantially increases the utility of the magnet permitting its use in a variety of applications without altering the size of the magnet or each pole pair therein or requiring a response switch operable within the negative magnetic flux region.

Figure 5:
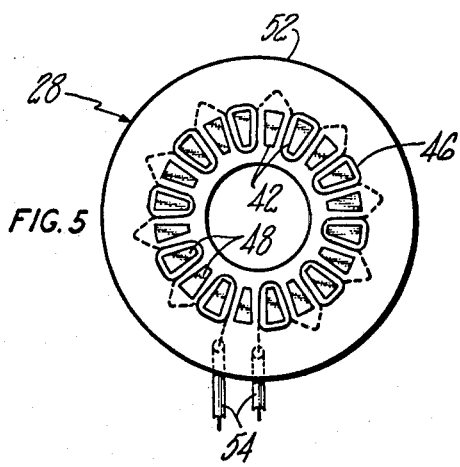
FIG. 5 is an end view of a magnetizing head used to produce the asymmetrical magnetic characteristics exhibited by the magnet of FIG. 1; and, FIG. 6 is a side view, partially broken away and partially in section, of the magnetizing head and magnet arrangement during a magnetizing operation.
Figure 6:
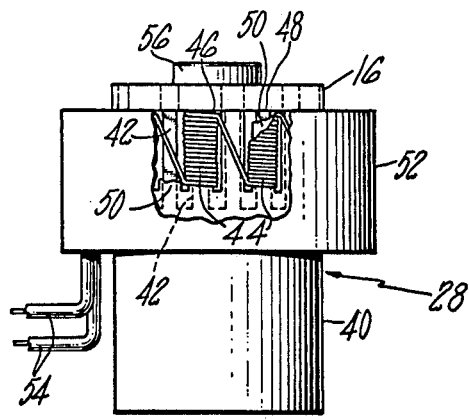

As mentioned, the multi-pole asymmetrical ring magnets 16 are preferably formed of suitable ceramic material capable of being magnetized to provide the desired array of predominant and subservient pole pairs 30. In accordance with the present invention this is achieved by utilizing a magnetizing head 28 of unique construction particularly adapted for imparting this asymmetrical magnetic character to flat disc-like members of the type used in the rotary pulse generator of the present invention. As shown in FIGS. 5 and 6 the magnetizing head 28 is a generally cylindrical tubular member having a series of windings at one end thereof in an appropriate array so as to provide the desired multipole asymmetrical configuration. More specifically the magnetizing head 28 consists of a cylindrical tubular metal core 40 having a plurality of equally spaced axially extending segments 42 at one end thereof. In the preferred embodiment wherein ten pole pairs 30 are desired within the asymmetrical magnet, the core is provided with twenty segments 42 of equal size and spacing located on 18° centers. The segments 42 extend along only a portion of the length of the cylindrical core 40 and alternate core segments are provided with an electrically conductive winding 44 with the final turn 46 thereof being located substantially flush with the free end face 48 of the core segments. As will be appreciated, one or more suitable electrical insulating layers 50 are provided between the core segments 42 and the winding 44 and an appropriate protective encasement 52 fully encloses both the segments and the winding in such a manner as to permit exposure of only the free end face 48 of each segment and the final turn 46 of the winding. The ends of the winding 44 are connected to suitable leads 54 extending outwardly from the encasement 52.

A typical example of a magnetizing head suitable for use in the present invention is a unit formed from a cold rolled steel cylinder measuring about ¾ inch OD by ½ inch ID and having a length of about 1 1/16 inches. The core segments 42 are provided by simply slotting one end of the cylinder to a depth of about 0.35 inch to provide twenty equally spaced segments located on 18° centers. The segmented portion of the core is then capped with an epoxy coating 50 that extends along the length of the core cylinder for a distance of about ½ inch from the end face 48 of the segments. If desired, the epoxy may be milled to provide precise internal and external diameters and slots may be cut in the coating between each of the segments 42. At this stage the core is sufficiently insulated by the epoxy coating to receive the magnetic winding.

The winding 44 may take the form of 16 turns of No. 26 gauge magnetic wire coiled about alternate segments and wound in the same direction so that ten of the twenty segments are thus wound. The ends of the completed winding may then be attached to appropriate lead wires 54 and the winding adjusted so that the last turn 46 of the winding on each of the 10 segments is positioned flush with the face 48 of its respective segment. The wound core is then placed within a potting mold which is filled with epoxy or other suitable potting material and allowed to cure to provide the protective enclosure 52 about the interior and exterior of the assembly. The segmented end face 48 may be ground flat to a point which just barely exposes the last turn of the magnetic wire.

As illustrated in FIG. 6, the magnetizing operation or procedure can be effected simply by placing a ceramic magnet blank on the centering pin 56 of the magnetizing head 28 so that it sits flush against the segmented faces 48 of the magnetizing head. A charging voltage is then applied to the magnetizing head long enough to induce the desired magnetic character in the magnet blank whereupon the magnetized blank can be removed from the centering pin and utilized within a rotary pulse generator of the type illustrated in FIG. 2.

As will be appreciated, other specific pickup or magnet assembly arrangements using the asymmetrical magnets could also be advantageously utilized such as for example, the arrangements described in Gamble, U.S. Pat. No. 3,742,243.

As will be appreciated by persons skilled in the art, various modifications, adaptations and variations of the foregoing specific disclosure can be made without departing from the teachings of the present invention.

I claim:

1. An asymmetrical magnet well suited for use in a rotary pulse generator comprising a multi-pole magnetic disc wherein the magnetic poles of the disc consist essentially of a plurality of pole pairs symmetrically spaced about the circumference of the disc with each pole pair including a predominant magnetic pole of one polarity and a subservient magnetic pole of the opposite polarity, the magnetic poles being oriented parallel to the axis of the disc.

2. The magnet of claim 1 wherein the disc is formed from barium ferrite material.

3. The magnet of claim 1 wherein the magnetic disc is provided with ten pole pairs located in a radial pattern on 36° centers.

4. The magnet of claim 1 wherein the predominant magnetic pole occupies a segment twice as large as the pole of opposite polarity and the magnet's salient magnetic field is of single polarity.

5. A multi-pole magnet comprising a planar member having magnetic poles consisting essentially of a plurality of symmetrically spaced pole pairs, each pole pair including a predominant magnetic pole of one polarity and a subservient magnetic pole of the opposite polarity to thereby provide an asymmetrical relationship between the poles of opposite polarity and a salient magnetic field having an effective single polarity, the magnetic poles being oriented perpendicular to the plane of the magnet.

6. The multi-pole magnet of claim 5 wherein the magnet is a flat planar member and the pole faces of each pole pair are located on the planar surfaces thereof.

7. The multi-pole magnet of claim 5 wherein the magnet is formed from barium ferrite material.

8. The multi-pole magnet of claim 5 wherein the predominant magnetic pole occupies a segment twice as large as the pole of opposite polarity.

* * * * *